(12) United States Patent
Bianchetti et al.

(10) Patent No.: US 8,809,685 B2
(45) Date of Patent: Aug. 19, 2014

(54) SUPERCONDUCTIVE CONNECTING DEVICE FOR THE END PIECES OF TWO SUPERCONDUCTORS AND METHOD FOR THE PRODUCTION THEREOF

(75) Inventors: Marco Bianchetti, Oxford (GB);
Marijn Pieter Oomen, Erlangen (DE);
Jacob Johan Rabbers, Baiersdorf (DE)

(73) Assignee: Siemens Aktiengesellschaft, Munich (DE)

( * ) Notice: Subject to any disclaimer, the term of this patent is extended or adjusted under 35 U.S.C. 154(b) by 107 days.

(21) Appl. No.: 13/321,878

(22) PCT Filed: Apr. 16, 2010

(86) PCT No.: PCT/EP2010/055031
§ 371 (c)(1),
(2), (4) Date: Nov. 22, 2011

(87) PCT Pub. No.: WO2010/136263
PCT Pub. Date: Dec. 2, 2010

(65) Prior Publication Data
US 2012/0061139 A1 Mar. 15, 2012

(30) Foreign Application Priority Data
May 26, 2009 (DE) .................. 10 2009 022 672

(51) Int. Cl.
*H01B 12/00* (2006.01)
*H01L 39/24* (2006.01)
(52) U.S. Cl.
USPC .................................. 174/125.1; 29/599
(58) Field of Classification Search
None
See application file for complete search history.

(56) References Cited

U.S. PATENT DOCUMENTS 4,797,510 A * 1/1989 Mihelich ................. 505/230
4,901,429 A * 2/1990 Srivastava ............... 29/599

(Continued)

FOREIGN PATENT DOCUMENTS

| CN | 101432930 | 5/2009 |
| DE | 3413167 A1 | 10/1985 |

(Continued)

OTHER PUBLICATIONS

C.A.Swenson et al.; IEEE Transactions on Applied Superconductivity; vol. 9, No. 2, Jun. 1999, Seiten 185 bis 187; Book; 1999.

(Continued)

*Primary Examiner* — Jayprakash N Gandhi
*Assistant Examiner* — Dion R Ferguson
(74) *Attorney, Agent, or Firm* — Harness, Dickey & Pierce, P.L.C.

(57) ABSTRACT

A superconductive connecting device of at least one embodiment is used to contact the end pieces of two superconductors, each of which includes at least one conductor lead that is made of a superconductive MgB2 material and embedded in a matrix made of a normally conductive material, the conductor lead being directly sheathed with a barrier material. In a connecting region, the conductor leads of the end pieces, which are at least partially stripped of the matrix material and the barrier material, are arranged inside a sleeve or bushing, and a magnesium diboride (MgB2) material is additionally present as a superconductive contacting material which is located at least in some partial regions between the conductor leads. For establishing the connection, the cross-section of the sleeve or bushing filled in this way is reduced.

19 Claims, 2 Drawing Sheets

(56) References Cited

U.S. PATENT DOCUMENTS

| | | | |
|---|---|---|---|
| 5,358,929 | A | 10/1994 | Fujikami et al. |
| 7,337,527 | B2 * | 3/2008 | Grasso et al. .................. 29/599 |
| 2006/0240991 | A1 | 10/2006 | Takahashi et al. |
| 2008/0236869 | A1 | 10/2008 | Marte et al. |
| 2009/0105079 | A1 | 4/2009 | Leghissa |

FOREIGN PATENT DOCUMENTS

| | | |
|---|---|---|
| EP | 0556837 A1 | 8/1993 |
| GB | 2 448 051 | 10/2008 |
| GB | 2448051 A | 10/2008 |
| JP | 2008258158 A | 10/2008 |
| WO | WO2007128635 * | 11/2007 ............... H01R 4/68 |
| WO | WO 2007128635 A1 | 11/2007 |

OTHER PUBLICATIONS

M.H.Lin, X.T.Zhou; Cryogenics; vol. 30 (Supplement), 1990, Seiten 626 bis 629; Book; 1990.

IEEE Transactions on Applied Superconductivity; vol. 15, No. 2, Jun. 2005, Seiten 3211 bis 3214; Book; 2005.

International Search Report for International Application No. PCT/EP2010/055031 dated Apr. 16, 2010.

Office Action for corresponding Chinese patent application No. 201080023081.7 dated Oct. 31, 2013.

* cited by examiner

SUPERCONDUCTIVE CONNECTING DEVICE FOR THE END PIECES OF TWO SUPERCONDUCTORS AND METHOD FOR THE PRODUCTION THEREOF

PRIORITY STATEMENT

This application is the national phase under 35 U.S.C. §371 of PCT International Application No. PCT/EP2010/055031 which has an International filing date of Apr. 16, 2010, which designated the United States of America, and which claims priority on German patent application number DE 10 2009 022 672.9 filed May 26, 2009, the entire contents of each of which are hereby incorporated herein by reference.

FIELD

At least one embodiment of the invention generally relates to a superconductive connecting device for the end pieces of at least two superconductors. In at least one embodiment, it relates to a superconductive connecting device for the end pieces of at least two superconductors, each of which includes a matrix made of normally conductive material and at least one conductor lead made of superconductive $MgB_2$ (magnesium diboride) embedded therein, whereby in a connecting region in a sleeve or bushing

- are arranged the conductor leads for the end pieces at least partially stripped of the matrix material and

- $MgB_2$ is additionally present as a superconductive contacting material which is located at least in some partial regions between the conductor leads.

BACKGROUND

A superconductive connecting device and also a method for the production of the connecting device are disclosed in WO 2007/128635 A1.

Superconductors using LTC (Low-$T_c$) superconductor material or HTC (High-$T_c$) superconductor material are produced amongst other things as so-called single-core conductors or multifilament conductors with a limited conductor length. With regard to a corresponding conductor construction of such conductors, the at least one superconductive conductor lead (or the at least one superconductive conductor filament) is embedded into a matrix made of normally conductive material. In particular during the construction of superconductive devices employing such superconductors such as for example magnet windings, it is necessary to contact or connect end pieces of corresponding conductors.

Some superconducting magnet windings, for example for magnetic resonance tomographs (also referred to as nuclear spin or NMR tomographs), need to be operated in so-called "persistent current mode". To this end, the magnet winding is short-circuited and the magnet current once set continues flowing without a current source for a practically unlimited period of time. This does however require that the energized circuit of the magnet winding has practically no electrical resistance. To this end, superconductive connections between individual superconductive conductors (superconductors) are also necessary. These superconductive connections do however react sensitively to magnetic fields. That is to say, if the magnetic field or the magnetic flux density exceeds a certain limit value, which is typically between 1 Tesla and 2 Tesla, then the connection exhibits an electrical resistance and thereby renders persistent current operation impossible. With regard to superconducting high field magnets, the magnetic flux density of which is for example 3 Tesla or higher, this results in problems because the connections must be placed at positions in which the local magnetic field lies below the stated limit value. In the case of very high fields, it can even become impossible.

A known superconductive connection for the end pieces of two superconductors is follows for example from "IEEE Transactions on Applied Superconductivity", Vol. 9, No. 2, June 1999, pp. 185 to 187. In order to establish this connection, at the end pieces to be connected of the superconductors the filaments thereof are exposed for example by means of etching and are then connected to another with the aid of a superconductive solder as a contacting material. As a general rule, lead compounds are employed as solders, for example made from the alloy Pb27—Bi50—Sn12—Cd10 (so-called "Wood's metal") or similar solders based on a Pb—Bi or Pb—Bi—Sn alloy. All these solder materials have an upper critical magnetic field $B_{c2}$ at most about 2 Tesla at a temperature of 4.2 K, the temperature of liquid helium at normal pressure. With regard to fields above this critical magnetic field, they lose their superconductive properties and are therefore frequently not suitable for the design of superconductive high field contacts.

A further connection technology for the end pieces of two superconductors can be found in "Cryogenics", Vol. 30 (Supplement), 1990, pp. 626 to 629. In this case, the superconductors are connected or pressed together with one another by means of spot welding or also diffusion bonding directly through the application of pressure and temperature without an intermediate material providing/promoting contact. The current carrying capacity of corresponding connections is however as a general rule less than that of the conductor itself. In this situation, the problem occurs that the filaments do not form large surface area contacts but rather point contacts. As magnetic field strengths increase, the current carrying capacity is then however further reduced, which means that connections of this type are also not suitable for many superconductive high field contacts.

A method can be found in DE 34 13 167 A1 for the production of a superconductive contact between superconductors, wherein at conductor end pieces made from a conductor precursor the conductor leads stripped of the matrix material are subjected to a pressure and temperature treatment process in a sleeve together with a certain powder material as an intermediate material. In this situation, the powder material is chosen such that superconductive material is formed with it during this treatment process and also from the conductor precursor. High temperatures in excess of 600° C. for example are however required in this situation. The known method therefore has a very high resource requirement and frequently cannot be employed.

A superconductive connection of end pieces of two superconductors and a method for the production thereof are known from WO 2007/128635 A1, wherein the connection can be produced below 600° C. through the use of $MgB_2$. In this situation, etching steps are used wherein a matrix material in which the $MgB_2$ conductor leads are embedded is removed. With regard to the etching step in which the $MgB_2$ material is exposed and is able to react with the ambient atmosphere, the $MgB_2$ material degrades and becomes brittle. It can crumble following the etching step, which renders a connection of the end pieces difficult or impossible.

SUMMARY

At least one embodiment of the present invention creates a connection or a connecting device between superconductive $MgB_2$ conductors at end pieces which on the one hand enable high magnetic flux densities of greater than 1 Tesla and in particular of greater than 2 Tesla without degradation of their current carrying capacity and on the other hand can be produced in a simple manner. A suitable method is further disclosed for the simple production of corresponding connections, wherein any damage to the $MgB_2$ conductor leads resulting from etching steps is reduced or completely prevented and crumbling of the end pieces does not occur or occurs to a reduced degree.

A superconductive connecting device is disclosed. Accordingly, in at least one embodiment, the $MgB_2$ conductor leads are directly sheathed with a barrier layer and embedded in a normally conductive matrix material, whereby the material of the barrier layer and the matrix material are different. The conductor leads of the end pieces are at least partially stripped of the matrix material and the barrier material is not present at least in an end-face connecting region of the conductor leads. Superconductive contacting material $MgB_2$ is present in a sleeve or bushing at least in partial regions between the conductor leads in the connecting region.

At least one advantage associated with at least one embodiment of the superconductive connecting device are in particular seen to reside in the fact that the connecting device
  essentially exhibits no degraded end pieces of the $MgB_2$ conductor leads,
  which also enables usage in high magnetic fields, and
  which is simple and cost-effective to produce without degrading the $MgB_2$ conductor leads to the point where the conductor leads crumble as a result of etching steps, whereby
  in general only washing, grinding and polishing and also pressing together of the end pieces to be connected are required, which means in many cases that it is possible to dispense with a special temperature treatment process, and whereby
  superconducting connecting devices result which behave in a robust and stable manner in particular with respect to flux jumps,
  and moreover etching which gives cause for concern from the environmental standpoint is not absolutely necessary.

The use of corresponding connecting devices in superconducting magnets makes possible persistent current operation in high magnetic fields, such as is required for example for high field magnets in magnetic resonance tomographs.

Advantageous developments of the superconductive connecting device according to at least one embodiment of the invention follow from the dependent claims. In this situation, the one embodiment can be combined with the features of one of the subclaims or preferably also those from a plurality of subclaims.

Accordingly, the connecting device according to at least one embodiment of the invention can additionally comprise the following features:
  Thus a greater surface area of the superconducting $MgB_2$ connecting region of the end pieces is achieved by beveling the end pieces.
  By preference, operation at a temperature below the transition temperature of 39 K of the $MgB_2$ contacting material is provided. The superconducting properties of the entire structure inside the sleeve or bushing can thus be ensured.
  In particular, an operating temperature at the temperature of liquid helium of about 4.2 K is to be provided, which permits the use of known superconductor technology devices.
  In this situation, the matrix material can consist of copper or nickel, or contain these materials or compounds of these materials. Copper and nickel can also be removed particularly simply without etching in a tin bath.
  The barrier material can consist of steel or stainless steel, or can contain these. This serves to ensure that on removal of the matrix material the conductor leads made of $MgB_2$ are essentially not attacked and do not degrade. Steel and in particular stainless steel are resistant in a tin bath and do not dissolve.
  Particularly advantageously, the superconductive connection can be associated with a superconductive magnet winding of a magnet such as in particular of a machine for magnetic resonance tomography. This is because the construction of magnets in particular for high field applications requires superconducting connections with a high current carrying capacity in the magnetic fields. The $MgB_2$ contacting material with undamaged, non-degraded conductor leads made of $MgB_2$ guarantees corresponding applications.
  On account of this property the superconductive connection is particularly suitable for a superconductive magnet winding designed for persistent current operation.

At least one embodiment of a method is disclosed. Accordingly, provision should be made with respect to at least one embodiment of the claimed superconductive connecting device such
  that the superconductive conductor leads are in each case stripped at least partially of their matrix material at the end pieces to be connected,
  that the sheathing barrier material is not removed during the stripping process,
  that in the connecting region on the end faces of the end pieces to be connected the $MgB_2$ material of the conductor leads is or has been at least partially exposed,
  that the conductor leads stripped in this way are inserted into the sleeve or bushing,
  that the $MgB_2$ contacting material is additionally inserted into the sleeve or bushing
and
  that the cross-section of the sleeve or bushing filled in this way is reduced.

The method of at least one embodiment is distinguished in particular by its simplicity. This is because solely the reduction in cross-section is advantageously already sufficient in many cases in order to create the desired connection, which also enables use under high field conditions.

In particular the barrier layer ensures in this situation with regard to stripping the conductor leads of the matrix material that the $MgB_2$ material of the conductor leads, which is surrounded by the barrier material, is not attacked and thus not degraded. After the stripping process, the $MgB_2$ material of the conductor leads is at least partially exposed at least on the end faces of the end pieces to be connected, or the previously already exposed $MgB_2$ material is shielded from the stripping process. By means of the $MgB_2$ contacting material inserted into the sleeve or bushing, particularly good superconducting electrical contacts result whilst reducing the cross-section of the sleeve or bushing.

Advantageous developments of the method for the production of the superconductive connecting device will emerge from the dependent claims. In this situation, at least one embodiment can be combined with the features of one of the subclaims dependent thereon or preferably also those from a plurality of subclaims. Accordingly, at least one embodiment of the method can additionally comprise the following features:

Prior to being inserted into the sleeve or bushing the end pieces with the superconductive $MgB_2$ and the barrier material are beveled in such a manner that the surface area of the exposed $MgB_2$ connecting regions is increased. Better contacts with a greater current carrying capacity result from the increased surface area.

The connecting regions are at least partially ground and/or polished. The surface areas of the connecting regions are thereby increased in a simple form and damaged $MgB_2$ regions at the ends of the conductor leads are possibly removed.

The matrix material is removed in a tin bath, whereby the conductor leads remain sheathed by the barrier material. This means that the etching step can be eliminated, whereby the barrier material continues to protect the $MgB_2$ material of the conductor leads.

The $MgB_2$ contacting material is inserted into the sleeve or bushing in powder form. It is thus possible to achieve a compact structure with intensive contacting between the superconductive parts and the contacting material.

The filled sleeve or bushing is subjected to a heat treatment process after or during the reduction in cross-section. The composite structure consisting of the different materials can thus be further improved, in particular in respect of the current carrying capacity in the case of high magnetic fields.

For this purpose the heat treatment process can be performed at a temperature of below 600° C., preferably below 250° C. A heat treatment process at the relatively low temperature in particular can be implemented with simple means.

The heat treatment process can be carried out in an argon atmosphere. By this, it is possible to prevent the penetration of oxygen and water into the $MgB_2$ material which causes this material to degrade and results in downgraded superconducting contacts. The method can be carried out more simply in argon than in a vacuum because a penetration of oxygen and water into the furnace for the heat treatment process is prevented more easily or with a lower resource requirement.

BRIEF DESCRIPTION OF THE DRAWINGS

For a more detailed description of the invention reference is made in the following to the figures which serve to further describe example embodiments of a superconductive connecting device according to the invention. In greatly schematized representation in the drawings.

In this situation, corresponding parts are identified by the same reference characters in the figures.

DETAILED DESCRIPTION OF THE EXAMPLE EMBODIMENTS

Figure 1:
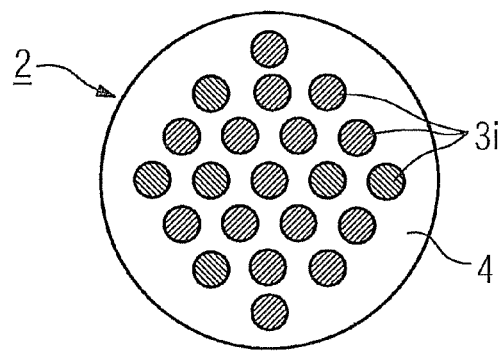
FIG. 1 shows a cross-section through a known multifilament superconductor in accordance with the prior art.

The superconductor shown in FIG. 1 is based on known embodiments. These can be so-called single-core (monocore) superconductors or otherwise, as assumed for the figure, so-called multifilament superconductors. Such a superconductor 2 has a plurality of superconductive conductor leads or filaments 3$i$ which are embedded into a matrix 4 of normally conductive material. The conductor leads 3$i$ are made from $MgB_2$ HTC superconductor material. Materials known for the matrix are either elemental (such as for example Cu, Ni, Ag, Fe, Wo, Al) or alloys, in particular of these elements (such as for example CuNi, AgMg, CuSn, CuZn or NiCr).

Figure 2:
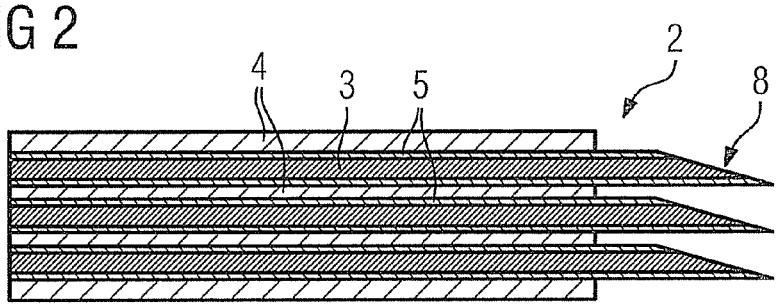
FIG. 2 shows a longitudinal section through a first embodiment of a multifilament superconductor, as used for the connecting device according to an embodiment of the invention.

FIG. 2 shows a superconductor 2 as a section along its longitudinal axis, as is used in the connecting device according to an embodiment of the invention. The superconductor 2 can be designed similar to the superconductor 2 in FIG. 1, or be constructed from tape conductors stacked above one another as conductor leads 3$i$. In contrast to the superconductor 2 represented in FIG. 1, the superconducting conductor leads 3$i$ of the superconductor 2 represented in FIG. 2 are sheathed with a barrier material 5. The barrier material 5 can consist for example of steel or stainless steel. Other stable metals such as niobium Nb can however also be employed as a barrier material 5.

The conductor leads 3$i$ are preferably beveled at their end-face ends. The beveled ends form the end-face connecting region 8. The connecting region 8 can be ground and/or polished. By this, the $MgB_2$ material of the conductor leads 3$i$ which for example has been damaged by the removal of the matrix material 4 is removed or exposed. By way of the barrier material 5, any damage to and any crumbling of further $MgB_2$ material of the conductor leads during removal of the matrix material 4 and thereafter is prevented. The connecting regions 8 exposed, ground and/or polished in this way yield very good superconducting contacts in the connecting device according to an embodiment of the invention.

Where applicable it is however also possible to expose at least the end faces of the conductor leads 3$i$ before the actual stripping process in respect of the matrix material 4. However, these exposed parts of the conductor leads must then be protected from the removal or etching agent during the stripping process by means of special measures.

Figure 3:
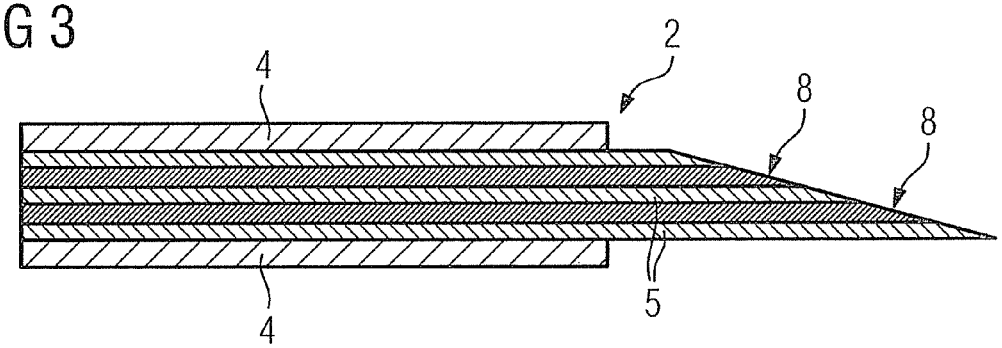
FIG. 3 shows a longitudinal section through a second embodiment of a multifilament superconductor.

The conductor leads 3$i$ may be present separately in the superconductor 2 as shown in FIG. 2, with matrix material 4 between the individual conductor leads 3$i$, or they may be designed together as a block as is represented in FIG. 3. The design of the conductor leads 3$i$ together as a block facilitates the grinding and/or polishing of the ends of the conductor leads 3$i$.

Figure 4:
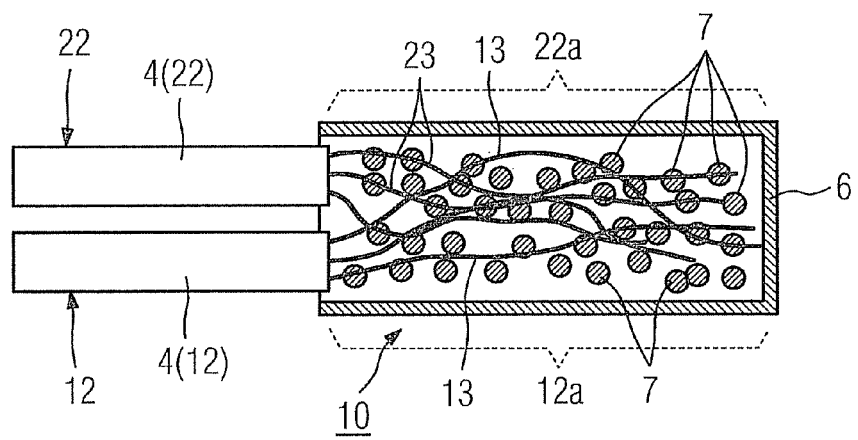
FIG. 4 shows a partially implemented section through a structure of a first embodiment of a connecting device according to the invention for multifilament superconductors.

FIG. 4 shows at least two end pieces of superconductors 2 which correspond to the superconductors 2 represented in FIG. 2 or 3, which are contacted with one another in low-resistance fashion by way of a connecting device according to an embodiment of the invention. Before contacting takes place, at least one superconductive conductor lead 3$i$ must be at least partially exposed in the region of the end pieces of the superconductors 2, in other words at least partially stripped of the matrix material by using techniques known for this purpose such as for example chemical etching, mechanical removal, in particular angular grinding.

In this situation, the conductor leads 3$i$ are protected by the barrier material 5. Crumbling of the $MgB_2$ material is prevented by the barrier material 5. Washing the ends of the conductor leads 3$i$ in a tin bath is particularly advantageous if the matrix material 4 dissolves in tin. This is the case for example if the matrix material 4 consists of copper. The removal of the matrix material 4 by way of a tin bath eliminates an etching operation. If steel or stainless steel is used as the barrier material 5, dissolution of the barrier material 5 in the tin bath is prevented and the barrier material 5 protects the MgB$_2$ material during washing in tin. The conductor leads 3i are thus not damaged.

When the conductor leads 3i are beveled by grinding and/or polishing, a connecting region is created at the end-face ends of the conductor leads 3i. In the connecting region the barrier material 5 is removed and undamaged MgB$_2$ material is available for contacting the conductor leads 3i.

In FIG. 4, two superconductors 12 and 22 are illustrated which are contacted at their ends in superconductive manner by way of a connecting device according to an embodiment of the invention. In this situation, 12a and 22a respectively denote their end pieces and 13 and 23 respectively denote their conductor leads which are correspondingly fully exposed there. The conductor leads are inserted into a bushing 6 or sleeve (cf. FIG. 5) together with an MgB$_2$ contacting material 7 which is present for example in powder form. A bushing or sleeve may be generally understood here as at least one arbitrary element accepting and at least partially surrounding the conductor leads 13 or 23 and the contacting material 7 in a known manner, by which it is possible to effect a compression or reduction in cross-section of the parts inserted thereinto.

The magnesium diboride (MgB$_2$) used according to an embodiment of the invention as the contacting material is a superconductive material having a critical temperature of approximately $T_c=39$ K (at normal pressure) and an upper critical field $B_{c2}$ (at 4.2 K) of greater than 40 Tesla. It is thus also suitable for use in high magnetic fields, such as occur for example in high field magnets in particular of magnetic resonance tomographs. By preference, therefore, the connection is operated according to an embodiment of the invention using the MgB$_2$ contacting material at temperatures of less than 39 K, for example at 4.2 K, whereby known cooling technologies are employed, such as for example with liquid helium. MgB$_2$ is commercially obtainable as a powder. It is capable, through suitable compression or rolling even without a temperature treatment or annealing process, of carrying a superconductive current (cf. "Applied Physics Letters", Vol. 79, 2001, pp. 230 to 233). On account of its relatively high critical temperature, this material is also particularly insensitive to interference such as for example flux jumps or conductor movements or undesired increases in the operating temperature which lead to a so-called quenching.

The bushing 6 to be filled with the exposed conductor leads 13 and 23 and also with the MgB$_2$ contacting material 7 in powder form consists preferably of a metallic material which is readily formable. Suitable materials for this purpose are elemental materials such as for example Cu, Ni, Ag, Nb, or Fe and also alloys such as for example steels, NbTi, NiCr or CuZn. In the bushing 6, in particular in the regions where the conductor leads 13 and 23 do not come to lie directly adjacent to one another, the spaces between the conductor leads are filled with the MgB$_2$ powder particles 7, only a few of which are illustrated in the figure for reasons of clarity. The formation of the desired contact between the conductor leads is then performed by way of a processing operation to reduce the cross-section at least of the region of the conductor end pieces to be connected, such as by compression or rolling. Where applicable, this contacting measure can also be improved by means of an annealing process, preferably at relatively low temperatures of less than 250° C. Naturally, where applicable, higher annealing temperatures up to 600° C. and above can also be used (cf. for example "IEEE Transactions on Applied Superconductivity", Vol. 15, No. 2, June 2005, pp. 3211 to 3214). The connection to be obtained in this manner is generally identified in the figure by the reference character 10.

Figure 5:
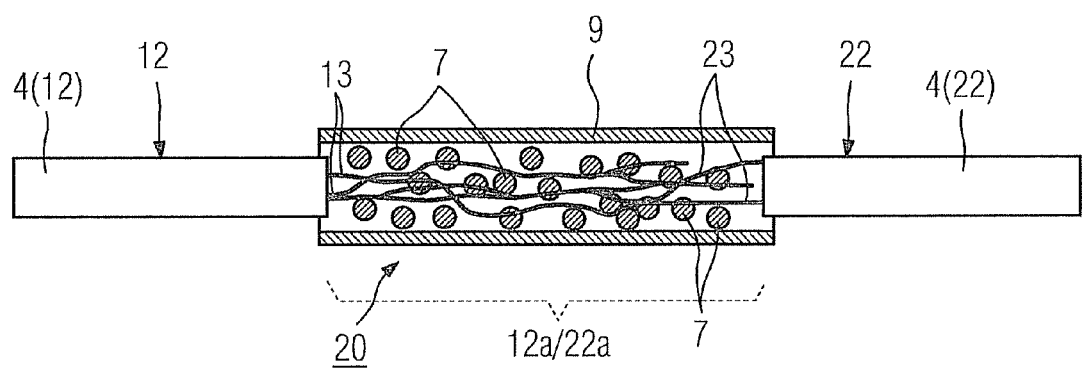
FIG. 5 shows the structure of a further embodiment of such a connecting device in a representation corresponding to FIG. 4.

A further embodiment illustrated in FIG. 5 of a superconductive connection, generally denoted by the reference character 20, differs from the superconductive connection 10 according to FIG. 4 in that here the two superconductive conductors 12 and 22 are contacted by their conductor leads 13 and 23 exposed in the region of their end pieces 12a and 22a being inserted into a sleeve 9 in the opposite direction together with the MgB$_2$ powder particles 7 and compressed there.

With regard to the embodiments of superconducting connections or connecting devices 10 and 20 respectively represented schematically in FIGS. 4 and 5, it has been assumed that the material of the matrix 4 has been completely removed in each case at the end pieces 12a and 22a of the superconductors 12 and 22 respectively. Where applicable, it is however also possible to free only some, for example half the cross-section, of the conductors of the matrix material 4 by mechanical or chemical means in the region of their end pieces, with the result that several of the conductor leads are then exposed at a surface of the remaining structure (cf. for example EP 0 556 837 A1). The surfaces exposed in this way of two conductor end pieces are then, including the MgB$_2$ contacting material, joined together and connected with one another in the manner described.

Furthermore, it has been assumed for the representation according to FIGS. 4 and 5 that in each case only two superconductors 12 and 13 are connected to one another electrically at their end pieces 12a and 13a. It is naturally also possible to insert a greater number of end pieces, for example of three superconductors, into a bushing 6 or a sleeve 9 and connect them to each other there.

The description has been based on the use of MgB$_2$ as the contacting material 7. Other base materials of MgB$_2$ can however also be used, for example Mg and Br precursor materials. When using precursor materials, the superconducting phase is formed by annealing in a known manner.

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

The invention claimed is:

1. A superconductive connecting device for end pieces of at least two superconductors, each of the at least two superconductors including a matrix made of normally conductive material and at least one conductor lead made of superconductive MgB$_2$ (magnesium diboride) embedded therein, the superconductive connecting device comprising:

a connecting region in a sleeve or bushing, wherein the at least one conductor lead of each of the at least two superconductors is arranged in the connecting region and end pieces of each of the at least two superconductors is completely stripped of matrix material, wherein MgB$_2$ or its base materials is present as a superconductive contacting material which is located at least in partial regions between the conductor leads, wherein the conductor leads are directly sheathed in each case with a barrier layer made of a barrier material different from the matrix material, and wherein at least one end-face connecting region is kept free of the barrier material which surrounds the conductor leads and the conductor leads are directly sheathed with barrier material in at least part of length sections where the conductor leads are stripped of the matrix material.

2. The superconductive connecting device as claimed in claim 1, wherein the end pieces with the superconductive $MgB_2$ and the barrier material are beveled.

3. The superconductive connecting device as claimed in claim 1, wherein operation at a temperature below the transition temperature of 39 K of the $MgB_2$ contacting material.

4. The superconductive connecting device as claimed in claim 3, wherein an operating temperature at the temperature of liquid helium of about 4.2 K.

5. The superconductive connecting device as claimed in claim 1, wherein the matrix material consists of copper or nickel, or the matrix material contains copper or nickel and/or the sleeve or bushing is sealed airtight and/or watertight.

6. The superconductive connecting device as claimed in claim 1, wherein the barrier material consists of steel or stainless steel or contains steel or stainless steel.

7. The superconductive connecting device as claimed in claim 1, wherein an association is included with a superconductive magnet winding of a magnet.

8. The superconductive connecting device as claimed in claim 7, wherein an association is included with a superconductive magnet winding of a magnet of a machine for magnetic resonance tomography.

9. The superconductive connecting device as claimed in claim 7, wherein an association is included with a superconductive magnet winding designed for persistent current operation.

10. A method for the production of a superconductive connecting device for end pieces of at least two superconductors, the connecting device including a connecting region in a sleeve or bushing, wherein at least one conductor lead for each of the end pieces is at least partially stripped of matrix material and arranged in the connecting region and wherein $MgB_2$ or its base materials is present as a superconductive contacting material which is located at least in partial regions between the conductor leads, wherein the conductor leads are directly sheathed in each case with a barrier layer made of a barrier material different from the matrix material, and wherein at least one end-face connecting region is kept free of the barrier material which surrounds the conductor leads, the method comprising:

stripping each of the superconductive conductor leads, completely, of their matrix material at the end pieces to be connected, wherein the barrier material is not removed during the stripping process;

at least partially exposing, in the connecting region at least on the end faces of the end pieces to be connected, the $MgB_2$ material of the conductor leads;

inserting the conductor leads, stripped in this way, into the sleeve or bushing;

additionally inserting the $MgB_2$ contacting material or its base materials into the sleeve or bushing; and reducing the cross-section of the sleeve or bushing filled in this way.

11. The method as claimed in claim 10, wherein, prior to being inserted into the sleeve or bushing, the end pieces with the superconductive $MgB_2$ and the barrier material are beveled in such a manner that the surface area of the exposed $MgB_2$ connecting regions is increased.

12. The method as claimed in claim 10, wherein the connecting regions are at least one of at least partially ground and polished.

13. The method as claimed in claim 10, wherein the matrix material is removed in a tin bath, whereby the conductor leads remain sheathed by the barrier material.

14. The method as claimed in claim 10, wherein the $MgB_2$ contacting material or its base materials is inserted into the sleeve or bushing in powder form and where applicable, is subjected to a heat treatment process.

15. The method as claimed in claim 10, wherein the filled sleeve or bushing is subjected to a heat treatment process after or during the reduction in cross-section.

16. The method as claimed in claim 15, wherein the filled sleeve or bushing is subjected to a heat treatment process after or during the reduction in cross-section at a temperature below 600° C.

17. The method as claimed in claim 16, wherein the filled sleeve or bushing is subjected to a heat treatment process after or during the reduction in cross-section at a temperature below 250° C.

18. The method as claimed in claim 15, wherein the heat treatment process is carried out in an argon atmosphere.

19. The method as claimed in claim 15, wherein the sleeve or bushing is sealed at least one of airtight and watertight.

\* \* \* \* \*